United States Patent [19]

Sakurai et al.

[11] Patent Number: 5,252,924
[45] Date of Patent: Oct. 12, 1993

[54] MAGNETIC FIELD GENERATING APPARATUS FOR MRI

[75] Inventors: Hideya Sakurai, Mishima; Junji Uzuki, Suita; Hirotaka Takeshima, Ryugasaki; Shigeru Sato, Fujishiro, all of Japan

[73] Assignees: Sumitomo Special Metals Co., Ltd., Osaka; Hitachi Medical Corp., Tokyo, both of Japan

[21] Appl. No.: 793,466

[22] Filed: Nov. 18, 1991

[51] Int. Cl.⁵ .............................................. G01V 3/00
[52] U.S. Cl. .................................... 324/320; 324/319; 335/296
[58] Field of Search ............... 324/300, 307, 319, 320, 324/322; 335/296, 301, 304

[56] References Cited

U.S. PATENT DOCUMENTS

| | | | |
|---|---|---|---|
| 4,644,313 | 2/1987 | Miyajima | 335/304 |
| 4,707,663 | 11/1987 | Minkoff et al. | 324/319 |
| 4,723,116 | 2/1988 | Müller et al. | 335/296 |
| 4,818,966 | 4/1989 | Miyamoto et al. | 335/296 |
| 4,827,235 | 5/1989 | Inomata et al. | 335/297 |
| 5,061,897 | 10/1991 | Danby et al. | 324/318 |

Primary Examiner—Louis Arana
Attorney, Agent, or Firm—Watson, Cole, Grindle & Watson

[57] ABSTRACT

A magnetic field generating apparatus for a magnetic resonance imaging (MRI) apparatus, including soft ferrite disposed adjacently to a gradient magnetic field coil which is disposed in a gap and serves to form a static magnetic field. The soft ferrite has saturated magnetic flux density (Rs) more than 0.4 T, coersive force (He) less than 50 A/m, and specific resistance $\rho$ more than $10^{-5}$ $\Omega$·cm. The magnetic field generating apparatus thus constructed has a magnetic circuit arrangement that a pair of permanent magnetic bodies which are disposed so as to confront each other and define the gap are magnetically connected through a yoke, and pole pieces are fixedly secured to the surfaces of the respective permanent magnetic bodies facing the gap, thereby generating the magnetic field in the gap.

11 Claims, 7 Drawing Sheets

PRIOR ART

PRIOR ART

MAGNETIC FIELD GENERATING APPARATUS FOR MRI

FIELD OF THE INVENTION

The present invention relates to an improvement of magnetic field generating apparatus for magnetic resonance imaging apparatus (MRI) for medical treatment use and the like, and also relates to an MRI magnetic field generating apparatus (MFGA) in which the uniformity of the magnetic field in a gap and the reduction of the eddy current and the residual magnetic phenomenon produced by a gradient magnetic field coil is obtained by arranging soft ferrite in the vicinity of the gradient magnetic field coil arranged in the gap for forming a static magnetic field.

DESCRIPTION OF RELATED ART

The MGI for medical treatment obtains a tomographic image of a person to be diagnosed and can illustrate the properties of human tissues by inserting a part of the human body to be diagnosed in the gap of the MFGA for forming a strong magnetic field.

In the above-described MFGA, the gap is required to have a width capable of inserting a part or the whole of the person to be diagnosed, and to obtain a clear tomographic image it is generally required that the imaging view in the gap form a stabilized strong uniform magnetic field having a magnetic strength of 0.05 to 2.0 T, and with an accuracy which is less than $1 \times 10^{-4}$.

MFGA for MRI include various kinds of structures such as are shown from FIGS. 6 to 9. The structure of FIG. 6 is mostly used in MRI which uses a permanent magnet as a magnetic field generating source. Such an embodiment generates a static magnetic field in the gap 4 between pole pieces 2, by adhering the pole pieces on respective terminals of the pair of permanent magnet bodies 1 in which Fe-B-R system magnets are used and connection is made to the other terminals by the yokes 3.

In the pole pieces 2 there is provided an annular protrusion 5 to improve the uniformity of the magnetic field distribution in the gap 4, and is a plate-like integral portion formed of magnetic material such as electromagnetic soft iron, pure iron, etc., in general as disclosed in Japanese Patent Laid-Open Application No. 88407/1985.

The gradient magnetic field coils 6 arranged in the vicinity of respective pole pieces 2 generally comprise three coil groups corresponding to three directions of X, Y and Z, but they are described as an abridgment in the figure.

In the gradient magnetic field coils 6 a gradient magnetic field of a desired direction and having a trapezoidal waveform can be generated by applying a pulse current. The embodiment of FIG. 7 is also of the type in which a permanent magnet is used as a magnetic field generating source, and a gap 4 for obtaining a static magnetic field in the inside of the cylindrical body by forming a plural number of permanent magnet bodies 1 having a trapezoidal shape in which an FE-B-R magnet system has been used. In the figure, the arrow shows the magnetization direction of the respective permanent magnet bodies.

Generally in this structure the arrangement of the pole pieces such as that shown in FIG. 6 are not required in the gap 4 counterfacing surfaces of respective permanent magnet bodies 1. In the figure, numeral 6 denotes gradient magnetic field coils.

FIG. 8 represents a type of MFGA in which an electromagnet has been used as a magnetic field generating source. That is, exciting coils 8 are arranged in the circumference of a pair of magnetic cores 7 having an annular protrusion 5 around the gap 4 counterfacing surface.

The exciting coils 8 can also be used in general as an ordinary conduction coil, but the use of a super conductive coil is also possible.

In FIG. 8 numerals 3 denote the yokes for maintaining the pair of magnetic cores 7 and numeral 6 denotes gradient magnetic field coils.

Magnetic cores 7 constituting the electromagnet are made of a integral plate-like body formed of a magnetic material such as electromagnetic soft iron, pure iron, etc., in the same manner as in the pole pieces 2 of FIG. 6.

FIG. 9 illustrates the type of MFGA in which a permanent magnet and an electromagnet have been combined and used as the magnetic field generating sources. That is, an electromagnet is arranged with the exciting coils 8 in the circumference of a pair of magnetic cores 7 having a ring-like protrusion 5 in the gap 4 counterposing surface and a pair of pillar-like permanent magnet of an Fe-B-R magnet system constituting bodies 1 have been magnetically arranged. In FIG. 9 numeral 6 denotes gradient Magnet field coils.

In any of the described embodiments, a highly accurate and stabilized uniform magnetic field is formed in gap 4.

Also, the gradient magnetic field coils 6 in any of the embodiments have the same construction as that shown in the explanation of FIG. 6, and perform the same function.

In the embodiment of FIG. 6, when a pulse current is passed in the gradient magnetic field coils 6, since the pole pieces 2 are constructed of an integral plate-shaped piece as described above, and since the magnetic field rise and fall times rapidly changes according to the magnetizing current, the eddy current is generated in the pole pieces 2.

Since this eddy current forms a magnetic field which is in the reverse direction to the magnetic field formed by the gradient magnetic field coils 6, much time is required for the gradient magnetic field to attain a predetermined strength.

As a means for solving the above-described problem, there has been proposed a magnetic field generating apparatus (Japanese Patent Laid-Open Application No. 203605/1986) in which a flat plate-shaped body comprising soft quality magnetic thin plates laminated in one direction is used as the pole pieces, and is constructed to be arranged and integrated in such a manner to let the laminate directions thereof become mutually different for approximately 90 degrees, and a magnetic field generating apparatus (Japanese Patent Laid-Open Application No. 25907/1988) in which a magnetic powder having high specific resistance has been used.

However, even in the construction in which the above-described eddy current reduction has been obtained, the pole pieces are magnetized by the magnetic field formed by the gradient magnetic field coil (GC), and there is a problem that the uniformity in the gap is disordered by the residual magnetism even after stopping the GC pulse by the magnetic hysteresis.

Even in the embodiments of FIGS. 8 and 9, from the fact that the magnetic cores 7 are constructed in the same manner as the pole pieces of FIG. 6 an eddy current is generated in the magnetic cores 7 by the gradient magnetic field coils 6 in the same manner as in the above-described case, and a similar problem results.

Although the pole pieces and the magnetic cores are not used in the embodiment of FIG. 7, a problem similar to that as described above is generated by the material quality of the permanent magnet. That is, in the well known permanent magnet, although the ferrite permanent magnet system having iron oxide as the main constituent has itself a large specific resistance ($\rho$), the other permanent magnets have comparatively small specific resistance ($\rho$), and the Fe-B-R permanent magnet system which is especially abundantly used in this field have small specific resistance, and the problem similar to that in the above-described applications is generated by the gradient magnetic field coil by the pole piece surfaces of the permanent magnet.

SUMMARY OF THE INVENTION

The present invention has been proposed in view of the above-described present status of the MFGA apparatus art and has as a primary object to provide a MFGA for MRI arranged with pole pieces which can reduce the eddy current and the residual magnetism phenomenon without lowering the magnetic field uniformity in the gap.

In the present invention, in the MFGA for MRI, an investigation has been carried out in various ways with the object of attaining a construction in which eddy current and residual magnetism phenomenon are reduced, and as a result, it was discovered that the eddy current and the residual magnetism phenomenom can be reduced by arranging soft ferrite in the vicinity of the gradient magnetic field coil arranged in the gap without lowering the magnetic field strength and the magnetic field uniformity, and forms the basis of the present invention.

That is, the present invention is a MFGA characterized by being arranged with soft ferrite in the vicinity of the gradient magnetic field coil and on the surfaces of the permanent magnets facing the gap forming a static magnetic field.

Although the present invention can be adopted in any embodiment of the described well known MFGA, but since similar effects can be obtained by changing the shape of the permanent magnet and the electromagnet, the shape of the yoke, the shape of the pole pieces and the magnetic cores, as well as the arrangement of these components, so that the present invention is not limited to the embodiments specifically described herein.

Especially in the construction arrangement of the pole pieces, the annular protrusion of various sectional forms may be disposed, or the center of the pole pieces may be disposed as a circular convex projection or trapezoidal projection as the need arises. And, in the desired position of the pole pieces, magnetic field adjusting pieces of magnetic materials or magnets may be arranged for the purpose of adjustment of the uniformity of the magnetic field.

In the present invention, in the case when a permanent magnet is used as a magnetic field generating source, ferrite magnets, alnico magnet systems, rare earth cobalt magnet systems can be used, but by the use of the FE-B-R permanent magnet system in which light rare earth compositions which are abundant and Nd and Pr elements are centered to be used as the R component, an extremely high energy product of more than 30 MGOe is obtained by making B and Fe as the main constituents, the embodiment can be made remarkably miniaturized.

Also, in the case of using an electromagnet as the magnetic field generating source, it is possible to use an ordinary conduction coil, and a super conduction coil as exciting coils arranged in the circumference of the magnetic cores, other than the conducting wire which are usually abundantly used heretofore, but it is desirable to select them by considering magnetic field strength, economy, etc.

Further, in the case when the electromagnet and the permanent magnet are used in combination, the material quality and the like are suitable selected respectively from the above-described respective constituents.

In the present invention, various kinds of materials can be used as the soft ferrite element, such as Mn-Zn ferrite powder, Ni-Zn ferrite powder, etc., and the one which has been worked from a large block made of soft ferrite in a desired shape, or the one which has been assembled in small blocks in a desired shape, etc., can be utilized.

Also, to produce the above-described small block, for example after compressing and molding the Mn-Zn ferrite powder and the like in a required shape, the product is sintered, and further for improvement of the density, it will suffice that the means such as HP, HIP (hot isostatic pressing) method and the like is used in combination, or it will suffice that the obtained small blocks are adhered by using an adhesive agent such as epoxy resin and the like to assemble them into a required shape.

Soft ferrite materials such as, for example, Mn-Zn soft ferrite systems have high permeability and high saturation magnetic flux density required for uniforming the magnetic field, and have sufficiently high specific resistance as an eddy current countermeasure, and characteristics of the low coercive force (several A/m) capable of preventing the residual magnetism phenomenom.

In the present invention, since the magnetic flux generated from the magnet constituting body can not be made to act effectively in the gap, it is desired that it is made more than 0.4 T. That is, the magnetic flux amount passing through the soft ferrite is determined by the Bs thereof, and when the value is small, it is inevitably saturated, and to present it, it is necessary to make the soft ferrite whole body thick so that the magnification of the MFGA becomes possible.

Therefore, Bs is desired to be more than 0.4 T, preferably more than 0.5 T and even more preferably more than 0.55 T.

Also, since there is generated a residual magnetism phenomenom in the case when the Hc of the soft ferrite is too large, it is desirable that Hc is less than 50 A/m, and preferable when it is less than 20 A/m, and even more preferably, when it is less than 10 A/m.

Also, for the reduction of the eddy current, it is desirable that specific resistance ($\rho$) is more than $10^{-5}$ $\Omega \cdot$m, and preferable when it is more than $10^{-3}$ $\Omega \cdot$m.

It is desirable that the most suitable arranging constitution of these ferrites is selected by the construction of the MFGA in such a manner as shown in the embodiment described later. For example, as shown in FIGS. 6, 8 and 9, in an embodiment where the gap 4 is formed with the counterfacing pole pieces 2 or magnetic cores 7, it is possible to construct the whole of these pole pieces 2 or magnetic cores 7 with soft ferrite. But, when the mechanical properties, magnetic efficiency, etc. of the ferrite itself are considered, the construction as shown in the following, in which the soft iron material and the like are used, is desirable. For example, when the construction as shown in FIG. 6, in which pole pieces 2 are arranged, is taken as the example, the base of soft iron material is laid in the side of the magnet-constituting body, or a soft iron integral part is also provided at the peripheral protrusion, and soft ferrite is arranged on the above-described base. By making the ratio of the base thickness of the soft iron material and the thickness of the soft ferrite pole to be most suitable, the uniformity of the magnetic field strength required for the pole pieces and the preventing effect of eddy current and residual magnetism phenomena is displayed to the greatest limit. Further, the reinforcement of the mechanical strength of the pole pieces consisting of the ferrite can be carried out.

For the base of the above-described soft iron material, pure iron, low carbon steel, etc., are preferable to obtain the desired material quality, and by adhering soft ferrite provide with a circular protrusion on the gap side circumferential part on a base of required thickness, the uniformity of the magnetic field can be obtained.

Or, it is also possible to make the circular protrusion provided on the circumferential part from soft iron material, and in this case, it is desirable to divide the circular protrusion by providing slits with the object of reducing the effect of the eddy current, and further, it is desirable that the part between the base and the circular protrusion, and the part between the base and the pole pieces, are electrically insulated.

In the combination of the soft ferrite of the pole pieces and the base of soft iron material, various conditions such as the thickness of the pole pieces and the like have restrictions in correspondence with the gap dimensions, the required magnetic field strength in the gap, the uniformity thereof, the shapes and mechanicl strength of the respective parts, etc., and when the maleffects due to the GC pulse can be reduced by the selection of the thickness of the soft ferrite only, the thinner the base thickness of the soft ferrite, the better it will be.

However, since the thinner the base thickness of the soft iron material, the higher becomes the passing magnetic flux density, and the magnetic hysteresis of the base itself becomes larger, it is necessary to optimize the ratio of the thickness of the soft ferrite and the base of the pole pieces.

The preferable range of the ratio of the base thickness of the soft iron material and the thickness of the soft ferrite is the base/soft ferrite thickness=0.25 to 2.

Also, in the embodiment in which the magnetic cores 7 are such as shown in FIGS. 8 and 9, it is preferable that not only the whole of the magnetic cores are combined using the bases of the soft iron material and the like similarly as in the above-described pole pieces.

Further, in the embodiment in which the pole pieces and magnetic cores are not arranged as shown in FIG. 7, as will be explained in detail later, the embodiment in which the soft ferrite having the above-described various characteristics are directly arranged on the pole piece surfaces of the magnet-constituting body is desirable.

The soft ferrite according to the present invention is not necessarily arranged on the whole of the surface of the magnets facing the gap, and for example, as shown in the later described FIGS. 1, 2 and 3, the core for arranging the gradient magnetic field could, and the annular protrusion as shown in FIG. 3, can be constructed from another material such as soft iron, the effect of the present invention is not damaged even by adopting such a construction. Further, even in one part of the soft ferrite in the soft ferrite part 13, such an arrangement is not necessarily required to be applied to the part where the influence of the eddy current is difficult to be directly received, and various kinds of construction can be adopted in correspondence to the shape of the pole pieces, the arrangement of the gradient magnetic coil, etc. Also, similar remarks apply to a magnetic circuit of such a construction in which the permanent magnet-constituting body is formed in a cylindrical shape as shown in FIG. 5.

DETAILED DESCRIPTION

Figure 1:
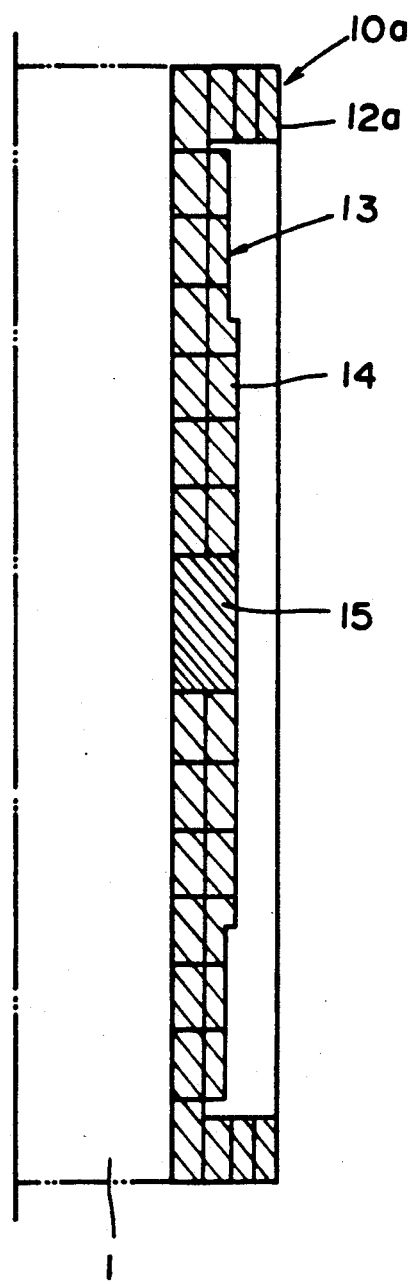
FIGS. 1-3 are the respective sectional diagrams for showing embodiments of the pole pieces of the MFGA according to the invention.

The pole pieces 10a shown in FIG. 1 have been constructed in such a manner that the whole of the pole pieces containing the circular protrusion provided on the gap side circumferential part is soft ferrite. That is, it comprises a soft ferrite part 13, which has been made by laying over many small blocks of a soft ferrite powder compressed and molded into a rectangular plate shape while laminating them with an adhesive agent, and an annular protrusion 12a which is made similarly by laminating the soft ferrite small blocks. Especially, the annular protrusion 12 has the role of assembling the magnetic flux into a required gap and improve the uniformity of the magnetic field, and similarly, by forming a circular convex projection 14 of a required diameter in the central part also, the uniformity of the magnetic field is improved.

Also, at the central part of the soft ferrite part 13 there is provided a core 15 made of soft iron as the foundation for equipping the gradient magnetic field coil.

Figure 2:
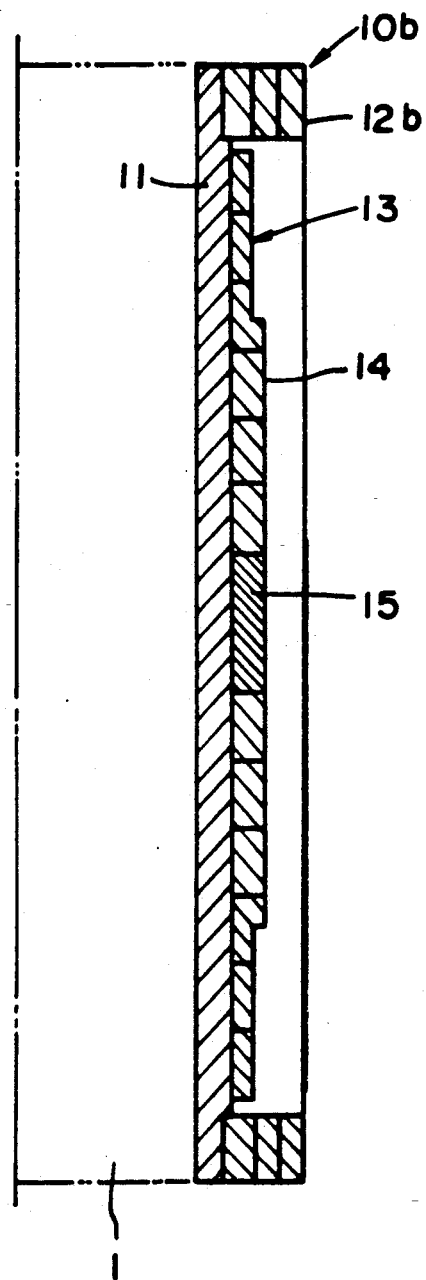

The pole pieces 10b shown in FIG. 2 are arranged with a base 11 of a circular plate shape of soft iron having a predetermined thickness between the magnet-constituting body 1 and the soft ferrite part 13 in the pole pieces shown in FIG. 1, and with this base 11, the mechanical strength and magnetic efficiency of the pole pieces 10b has been improved.

Figure 3:
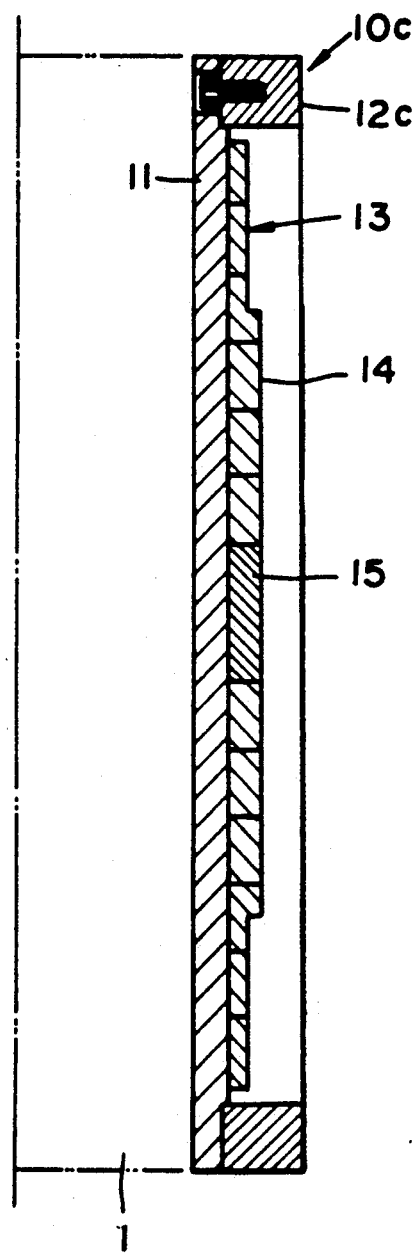
Figure 4:
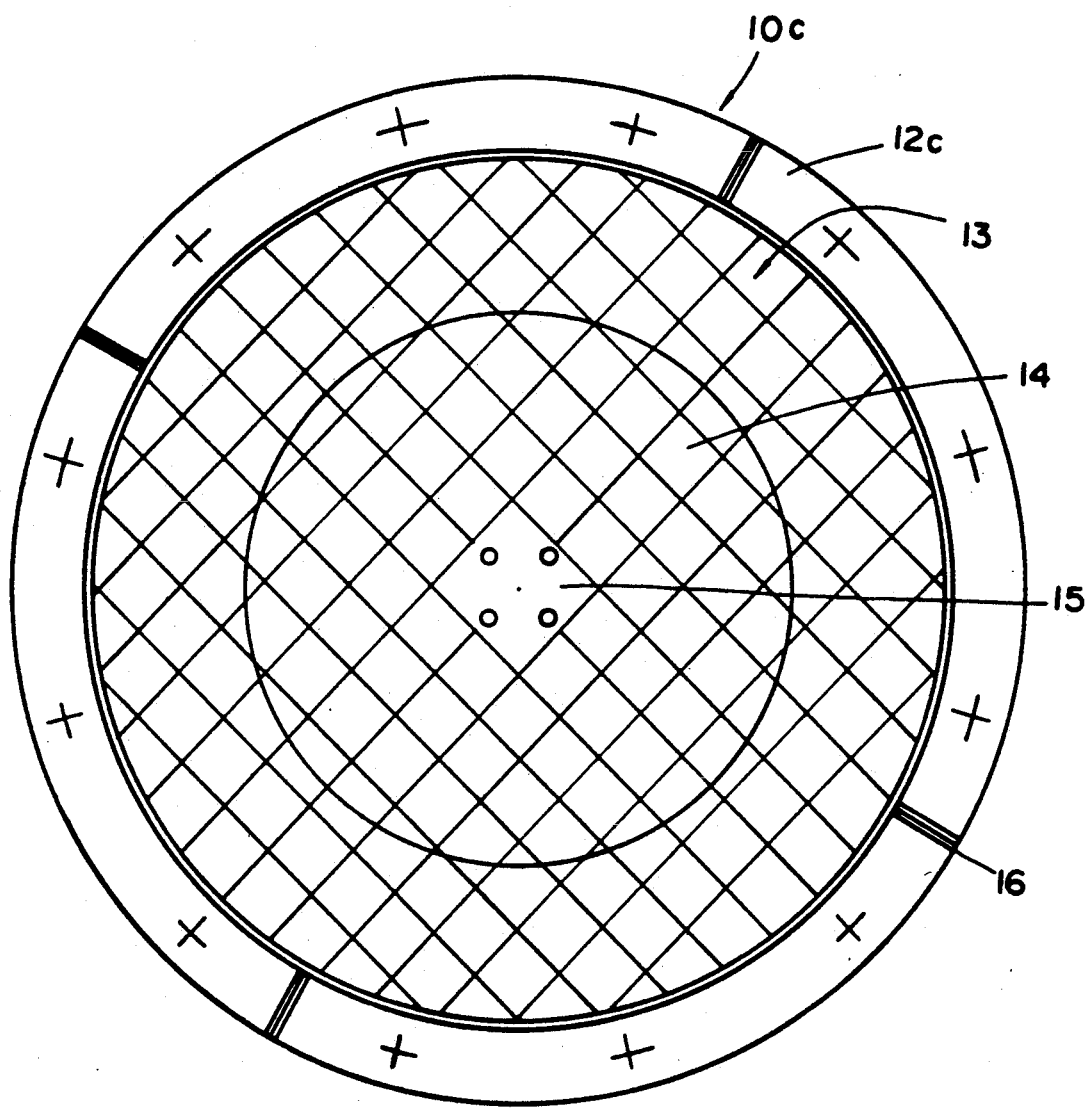
FIG. 4 is a top view diagram of the pole pieces shown in FIG. 3.

The pole pieces 10c shown in FIGS. 3 and 4 comprise a soft iron circular base plate 11, an annular protrusion 12c made of soft iron of rectangular section set in the circumferential part of the base 11, and a soft ferrite part 13 layed on the surface of the base 11 facing the gap by assembling many small blocks of soft ferrite in a circular plate shape with an adhesive agent.

The annular protrusion 12c made of soft iron of a rectangular section set on the circumferential part of the base 11 is made in such a manner that the height of the side of the external circumferential part of the pole pieces 10c is higher than that of the other part to concentrate the magnetic flux in the required gap and to improve the magnetic field uniformity, and an insulating material is sandwiched between the base 11 and the annular protrusion 12c and fastened with bolts. Additionally, slits 16 are provided by dividing the annular protrusion 12c to reduce the influence of the eddy current.

Although the soft ferrite part 13 has been assembled in a circular plate shape as described above, but since the circular convex part 14 of a required diameter is formed in the central part, compressed and molded soft ferrite small blocks of different thickness are used, and the magnetic field uniformity can be improved by the circular convex part 14.

Also a core 15 made of soft iron is provided in the central part of the soft ferrite part 13 for forming the foundation of the gradient magnetic coil.

Figure 6:
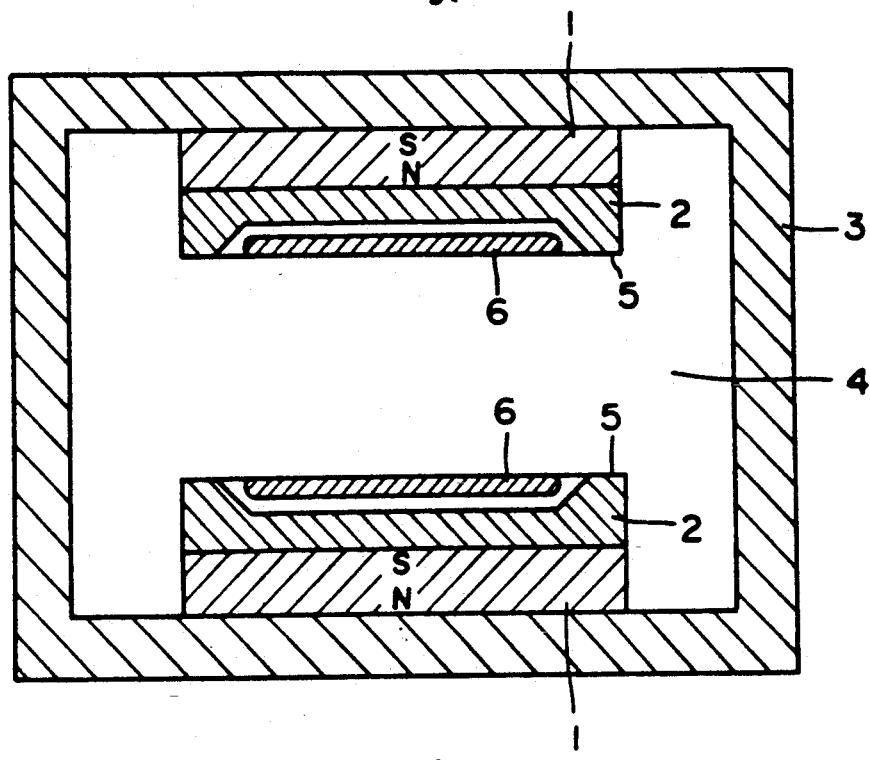
FIG. 6 is a sectional view showing the MFGA according to the prior art.
Figure 7:
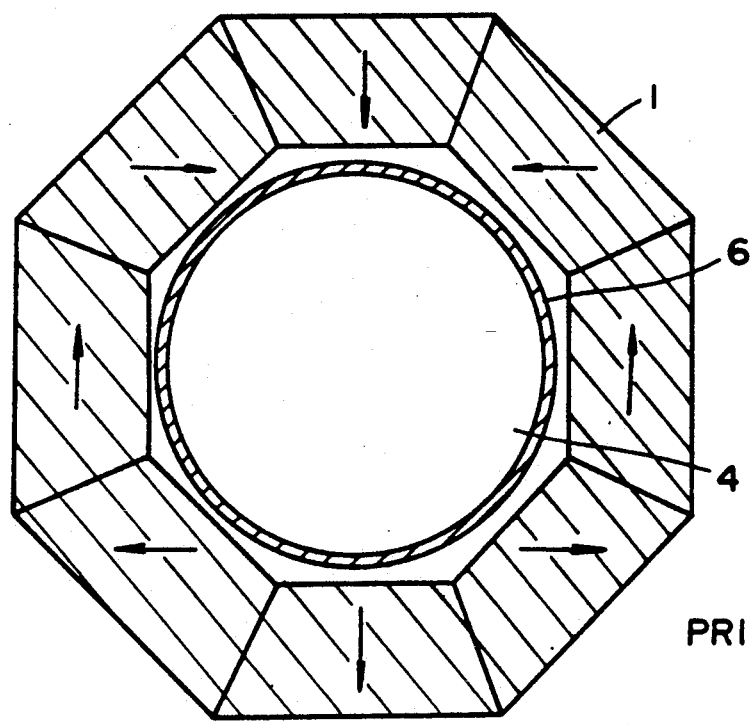
FIG. 7 is a top view of the MFGA of another type of prior art apparatus.

When the pole pieces 10a, 10b and 10c comprising such a construction are used in the MFGA for MRI as shown in FIG. 6, in any of the pole pieces, there is the effect of making the magnetic field of the gap uniform and the eddy currents due to the gradient magnetic coil are reduced, and also there is the effect of reducing the residual magnetism generated by the GC pulse.

Figure 8:
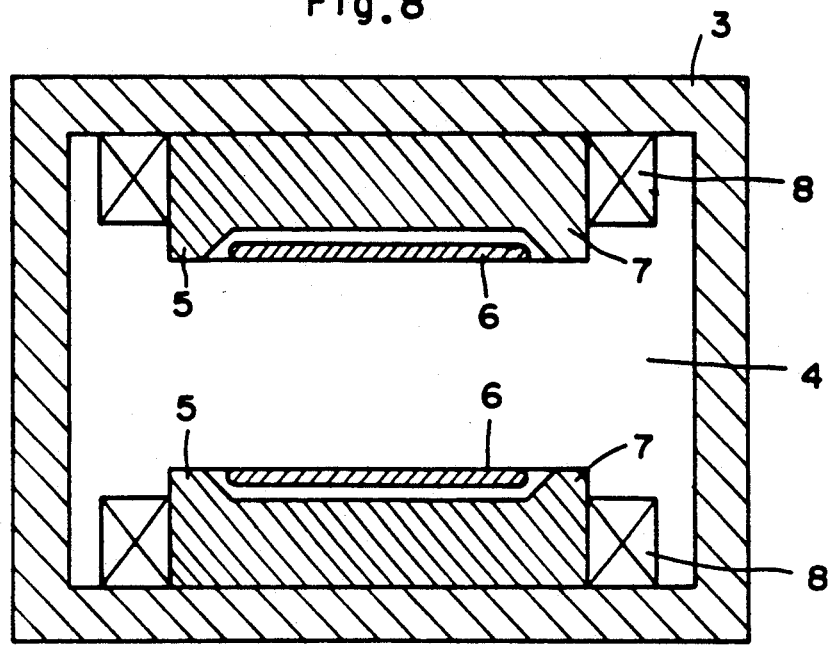
FIGS. 8 and 9 are respective sectional views showing the MFGA according to still another type of prior art apparatus.
Figure 9:
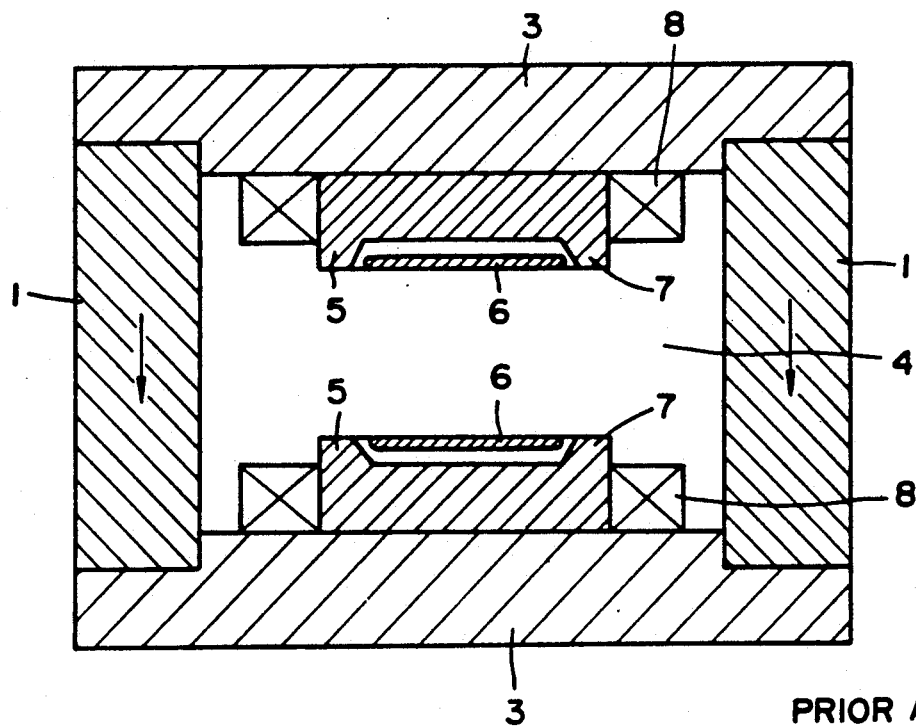

The pole pieces construction described above can obtain a similar effect by adopting the magnetic cores 7 in the MFGA of FIGS. 8 and 9 in the same manner as has been explained previously.

Figure 5:
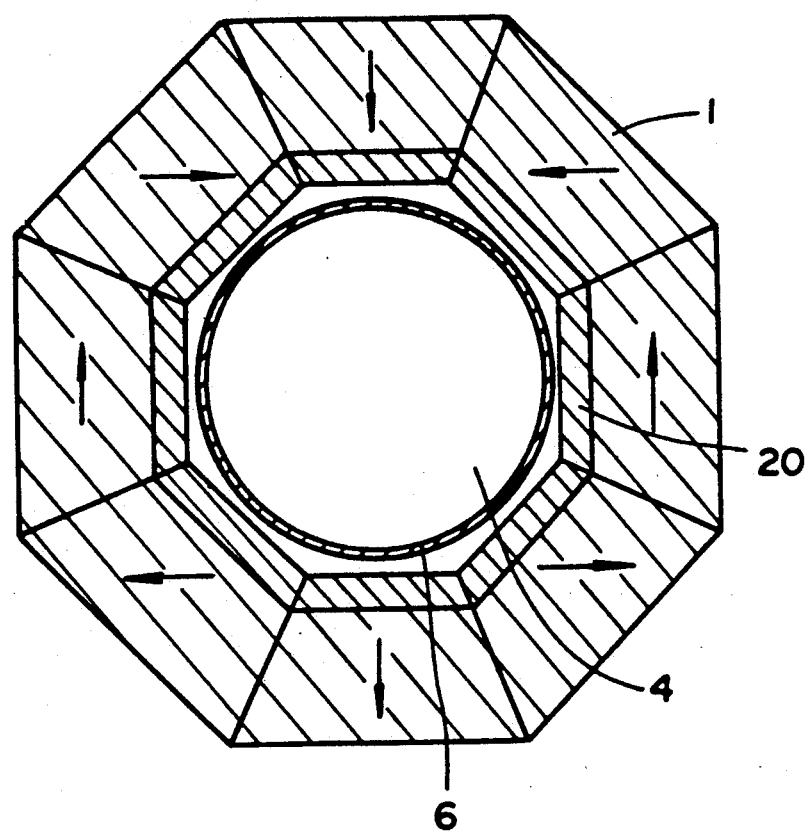
FIG. 5 is a sectional diagram for showing another embodiment of the MFGA according to the invention.

FIG. 5 shows another embodiment of the MFGA of the present invention, i.e. it has a construction in which soft ferrites 20 of trapezoidal section are adhered on the surfaces facing the respective gap 4 of a plural number of permanent magnet-constituting bodies 1 of a trapezoidal section to prevent influence by the gradient magnetic field coil. In this construction, in general, it is not necessary to arrange the base and the like between the permanent magnet-constituting body and the soft ferrite 20 in such a manner as described above, but when the use of the base is necessary, due to the assembling workability and the like of the soft ferrite 20, no effect is lost by so arranging them.

DESCRIPTION OF A SPECIFIC EMBODIMENT

In the MFGA of the same constructions as that of FIG. 6, a soft ferrite part was provided on the base consisting of soft iron of the following properties by the use of an Fe-B-R permanent magnet system having a maximum BH of 35 MGOe, and the counterfacing distance of a pair of pole pieces provided with an annular protrusion consisting of soft iron was set at 500 mm, and the magnetic field in the gap was measured. As a result, as the measured value in the measuring space at a radius of 200 mm from the center of the gap, a magnetic field uniformity of 33 ppm and a magnetic field strength of 2.0 kg was obtained.

The residual magnetism generated by the GC pulse was, in the case of the present invention, in comparison with that of the conventional one in which the pole pieces of the same dimension and shape are constituted of the bulk material of the same soft iron as that of the base, reduced to less than $\frac{1}{3}$.

BASE: Pure iron, $Hc = 80$ A/m; $Bs = 2.0$ T; $\Sigma = 1 \times 10^{-7}$ $\Omega \cdot m$; and the soft ferrite part: Mn-Zn ferrite magnet system; $Hc = 6.0$ A/m; $Bs = 0.58$ T; and $\rho = 0.2 \Omega \cdot m$.

What is claimed is:

1. A magnetic field generating apparatus for MRI, comprising:
   a plurality of pairs of magnet bodies arranged to form an air gap;
   yokes for supporting and magnetically connecting the plurality of paired magnet bodies;
   base members, each made of soft iron material and disposed on the surface of the plurality of pairs of magnet bodies to confront the air gap;
   annular projections, each deposited around the circumference of each of the base members; and
   a plurality of soft ferrite segments made of Mn-Zn series soft ferrite and deposited to be closely adjacent to one another on the surface of each of the base members except each of the annular projections, and forming a substantially circular convex portion around a center of the base member and a thickness t of the base member and a thickness T of the ferrite segments have a thickness ratio of 0.25 to 2.

2. A magnetic field generating apparatus according to claim 1, wherein the Mn-Zn series soft ferrite segments are of a saturated magnetic flux density Bs of more than 0.5 T, a coercive force Hc of less than 10 A/m and a specific resistance $\rho$ of more than $10^{-3}$ $\Omega \cdot m$.

3. A magnetic field generating apparatus according to claim 1, wherein a plurality of Mn-Zn series soft ferrite segments, each having a rectangular plate shape, are deposited integrally on the base members by an insulative adhesive agent to be in a desired formation.

4. A magnetic field generating apparatus according to claim 1, wherein the base members are made of pure iron.

5. A magnetic field generating apparatus according to claim 1, wherein a core made of soft iron material is provided on the base members at a central part of the soft ferrite segments and for mounting thereon a gradient magnetic field coil.

6. A magnetic field generating apparatus according to claim 1, wherein the thickness ratio t/T is 1 to 1.5.

7. A magnetic field generating apparatus according to claim 1, wherein the annular convex portion is made of a soft iron material.

8. A magnetic field generating apparatus according to claim 1, wherein the annular convex portion is divided into the plural circumferential sections by radially extended slits.

9. A magnetic field generating apparatus according to claim 1, wherein the annular convex portion is made of soft ferrite.

10. A magnetic field generating apparatus according to claim 1, wherein the plurality of magnet bodies are formed by permanent magnets.

11. A magnetic field generating apparatus according to claim 1, wherein the plurality of magnet bodies are formed with an electro-magnet or a combination of permanent magnets and electro-magnets.

* * * * *